United States Patent
Normann et al.

[19]

[11] Patent Number: 6,155,119
[45] Date of Patent: Dec. 5, 2000

[54] ARRANGEMENT COMPRISING AN ELECTRICAL PRINTED-CIRCUIT BOARD AND AN ELECTRICAL PRESSURE PICK-UP

[75] Inventors: Norbert Normann, NiefernÖschelbronn; Andreas Kühnle, Maulbronn, both of Germany

[73] Assignee: AMI Doduco GmbH, Pforzheim, Germany

[21] Appl. No.: 09/125,419

[22] PCT Filed: Feb. 15, 1997

[86] PCT No.: PCT/EP97/00724

§ 371 Date: Jan. 11, 1999

§ 102(e) Date: Jan. 11, 1999

[87] PCT Pub. No.: WO97/30334

PCT Pub. Date: Aug. 21, 1997

[30] Foreign Application Priority Data

Feb. 16, 1996 [DE] Germany .......................... 196 05 795

[51] Int. Cl.[7] .................................. G01L 7/00; G01L 9/00
[52] U.S. Cl. .................................................. 73/756; 73/756
[58] Field of Search ................................ 73/146.2, 146.3, 73/756, 754, 707, 715, 716, 717, 718, 719, 720, 721, 723, 724, 725, 726, 727, 753

[56] References Cited

U.S. PATENT DOCUMENTS

| 4,413,524 | 11/1983 | Kosh . | |
|---|---|---|---|
| 4,507,971 | 4/1985 | Vachek | 73/707 |
| 4,920,805 | 5/1990 | Yajima . | |
| 5,125,275 | 6/1992 | Wilda et al. | 73/756 |
| 5,557,049 | 9/1996 | Ratner | 73/756 |
| 5,648,615 | 7/1997 | Jeske et al. | 73/756 |
| 5,708,411 | 1/1998 | Hill | 73/146.2 |

FOREIGN PATENT DOCUMENTS

| 0145861 | 9/1984 | European Pat. Off. . |
| 0288827 | 4/1988 | European Pat. Off. . |
| 4133061 | 4/1991 | European Pat. Off. . |
| 0677727 | 4/1994 | European Pat. Off. . |
| 0626572 | 11/1994 | European Pat. Off. . |
| 3003449 | 2/1979 | Germany . |
| 4400439 | 11/1993 | Germany . |

*Primary Examiner*—Harshad Patel
*Assistant Examiner*—Abdukahi Aw-Musse
*Attorney, Agent, or Firm*—Orum & Roth

[57] ABSTRACT

An arrangement made up of an electrical circuit board (7) and an electrical pressure transducer (1) which has, in a housing (2), a pressure sensor onto which the pressure to be measured is transferred by means of a fluid through a channel (5) leading into the housing (2), and from which there proceed electrical lines which project out of the housing (2) as leads (4) and are connected to the circuit board (7). The channel (5) is shielded on the outer side of the housing (2) so that the flow resistance for fluid entering and leaving the channel (5) increases.

21 Claims, 4 Drawing Sheets

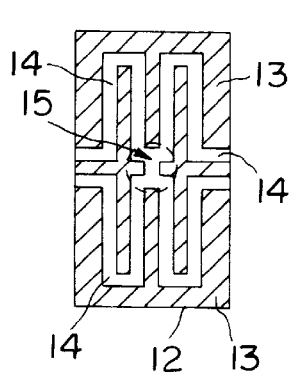
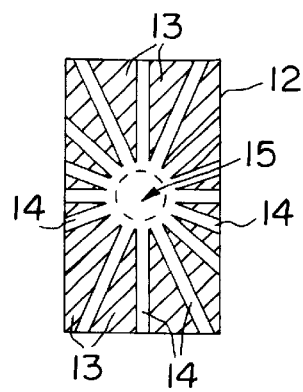
FIG. 16   FIG. 17
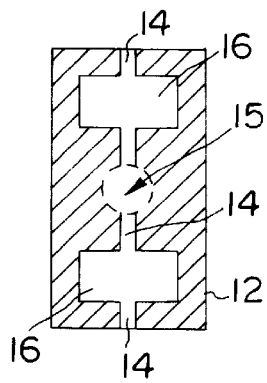
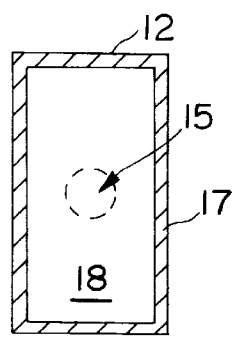
FIG. 18   FIG. 19
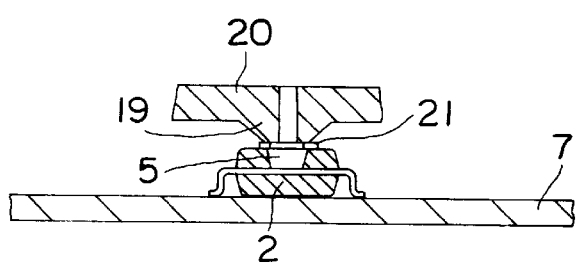
FIG. 20
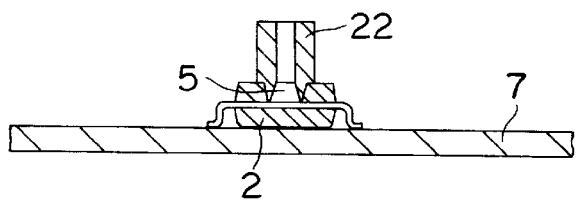
FIG. 21

ARRANGEMENT COMPRISING AN ELECTRICAL PRINTED-CIRCUIT BOARD AND AN ELECTRICAL PRESSURE PICK-UP

The invention relates to an arrangement made up of an electrical circuit board and an electrical pressure transducer which has, in a housing, a pressure sensor onto which the pressure to be measured is transferred by means of a fluid through a channel leading into the housing, and from which there proceed electrical lines which project out of the housing as leads and are connected to the circuit board. A "fluid" here is understood to be a gaseous medium or a liquid, the gaseous medium (in particular air) being the preferred application. Connection between the pressure transducer and the circuit board is usually accomplished by pushing the leads through holes in the circuit board and soldering them to the underside of the circuit board, and partially also to the upper side of the circuit board. The pressure transducer generally comprises a semiconductor-based pressure sensor which is embedded in a parallelepipedal housing which consists of a plastic molding compound. Provided in the housing on the side facing away from the circuit board is a channel through which the medium (usually air) transferring the pressure to be measured can transfer the pressure onto the pressure sensor. Because of their small size, such pressure transducers generally respond very quickly to pressure changes—in many cases much more quickly than is desired. This requires an increased effort when analyzing the pressure sensor signal if the intention is to prevent rapid, short-term pressure fluctuations from causing unnecessary reactions of a monitoring device or even an unnecessary alarm. To counteract this, the output signal of the sensor can be subsequently damped electrically and/or electronically, or, if a specific signal analysis system is provided, the signal analysis algorithm can be configured such that low-pass filtration and thus damping of the response characteristics of the sensor are achieved. The conventional means therefor is the use of an RC section. Subsequent damping of the pressure sensor represents an error source, and requires an additional circuit outlay which goes against the trend toward simplification and miniaturization. A pressure sensor that is small but nevertheless does not respond so quickly would be desirable, but the trend toward miniaturization goes hand in hand with increasingly fast response characteristics.

It is the object of the present invention to indicate a way in which to arrive, without major effort, at small electronic pressure transducers whose output signal does not need subsequently to be electronically damped. The concrete starting point for this problem is the search for a suitable pressure transducer for monitoring the air pressure in vehicle tires. This requires a pressure transducer which on the one hand is so small that it can be housed together with a battery and an active electronic circuit in or on the valve base, but on the other hand is so slow-reacting that it does not respond to the unavoidable rapid pressure changes occurring while driving, but responds only to the slower pressure changes occurring as a result of leaks or tire damage, upon which the more rapid pressure changes are superimposed. Pressure fluctuations whose rate of change in pressure is greater than 500 mbar/s are of no interest in this context, and merely complicate analysis of the pressure sensor output signal.

According to the invention, an arrangement having the features indicated in claim 1 is proposed in order to achieve the stated object. Advantageous developments of the invention are the subject of the dependent claims.

The invention has the advantage that it allows the use of very small, fast-responding electronic pressure transducers, but requires no subsequent damping of their output signal. This is achieved in that the pressure transducer is mechanically damped with the simplest of means, by the fact that the channel through which the pressure to be measured is guided to the pressure sensor is shielded in suitable fashion on the outside of the housing, so that the flow resistance for the fluid entering the channel (in the case of a rise in pressure) and for the fluid emerging from the channel (in the case of a drop in pressure) increases, and rapid pressure fluctuations are thereby suppressed before they reach the pressure sensor.

According to the invention, no complex features at all are needed to arrive at this result. It is sufficient to adhesively bond onto the housing of the pressure transducer a thin plate which covers the channel and makes it sufficiently difficult for the pressure-transferring fluid (in particular, air) to enter. Entry can be made possible by the fact that the plate is perforated, or that the plate is arranged at a defined small distance from the surface of the housing (e.g. by the fact that the plate has flat projections on its underside), or by the fact that channels are provided in the plate and/or in the surface of the housing of the pressure transducer, covered by the respective opposing part, which lead from the edge of the plate to the region of the channel and whose length and cross section determine the flow resistance. A high flow resistance can, for example, be achieved not only by the fact that the flow cross sections, considered together, are small, but also by the fact that the flow paths are long, which can be achieved by enlarging the plate and/or guiding the channels circuitously (in meandering or spiral form). One particular advantage is that in this fashion, one and the same pressure transducer can be damped to different degrees depending on the application, by correspondingly selecting different plate configurations and flow paths delimited by the plate and by the surface of the pressure transducer housing.

A development of the invention in which the pressure transducer is joined to the circuit board using SMD technology is particularly preferred. With SMD technology, the leads of the pressure transducer are not pushed through holes in the circuit board and soldered, but rather the leads are bent into a J-, L-, or Z-shape, placed on the surface of the circuit board, and soldered to it (SMD surface mounted device). SMD technology is an efficient way of allowing a high packing density on the circuit board, which is important for miniaturization of assemblies, and is favorable for the application preferred here (tire pressure monitoring). The invention is particularly advantageous in combination with SMD technology if the pressure transducer are arranged not in the usual fashion so that its channel faces away from the circuit board, but so that it faces toward the circuit board. For this purpose, the leads of the pressure transducer must be bent in the opposite direction from what is usual, i.e. toward the housing side on which the pressure channel is located. Trimming and shaping of the leads can be accomplished in known fashion in a punching and bending tool, and yields a reproducible shape and position for the leads. In a development of the invention, this can be exploited by configuring the punching and bending tool in such a way that with their bent-over feet which are intended to rest on the circuit board, the leads project by a defined slight amount beyond the surface of the pressure transducer housing, so that when the pressure transducer is soldered to the circuit board, a narrow gap which offers the desired flow resistance is automatically created between it and the pressure transducer housing. Creating the desired flow resistance thus requires neither an additional component nor an additional production step. It is also possible, however, to mount the pressure transducer housing on the circuit board with a sealed gap or with no gap, and to provide in the circuit board one or more holes constituting the flow resistance, which open into the channel of the pressure transducer. An arrangement of this kind is possible with SMD technology because with SMD technology, the rear side of the circuit board is not passed over a wave-soldering bath.

The damping effect of the flow resistance can be enhanced by combining the flow resistance with a pressure capacitance which is enlarged as compared with the cubic capacity of the channel. The pressure capacitance consists of the space which is occupied by the fluid between the flow resistance and the electronic pressure sensor, and includes the volume of the pressure channel in the pressure transducer housing. The flow resistance and the pressure capacitance in combination display low-pass behavior similar to that of an electrical RC section, and may therefore be construed as a fluid low-pass or pressure low-pass. Enlarging the pressure capacitance (chamber volume between the flow resistance and the pressure sensor) increases the time constant which determines the response characteristics of the pressure transducer, thus yielding greater damping. An enlargement of this kind can be achieved in various ways, for example by shielding the channel in the pressure transducer housing using a cap whose volume is added to the volume of the channel. When the volumes involved are small, a cap of this kind could be constituted by a hollowed-out plate, but could also be realized with a convex shaped element, for example a stamped sheet. The pressure capacitance can also be increased by widening the channel provided in the pressure transducer, especially in steps. The widening can extend over almost the entire upper side of the housing of the pressure sensor.

A further advantageous possibility for increasing the time constant of the pressure transducer consists in providing, in the cavity constituting the pressure capacitance, a filter material, in particular a small-pore dust filter, which increases the flow resistance and has the additional advantage of preventing or at least interfering with the penetration of dust and other troublesome particles into the channel. A filter material can also be adhesively bonded onto the outer side of the shielding, if the latter is perforated, to allow fluid to enter the channel. If the hole(s) provided in the shielding are sufficiently narrow, the advantage is then that they shield the channel in the pressure transducer housing not only from rapid pressure fluctuations but also from contamination. The perforations or holes in the shielding are protected from clogging by a dust filter adhesively bonded onto the outer side of the shielding.

The creation of a flow resistance not only has the advantage of damping the pressure transducer, but also offers production advantages. Assemblies manufactured using SMD technology are usually encapsulated with a synthetic resin-based sealing compound, or coated with a protective lacquer. This is facilitated by the shielding and by the new manner in which the pressure transducer is arranged, since they are suitable for preventing the penetration of sealing compound into the channel of the pressure transducer housing, if the flow cross sections which constitute the flow resistance being provided and the viscosity of the sealing compound are coordinated with one another so that the sealing compound cannot flow beneath the shielding.

Drawings are appended for further elucidation of the invention.

Figure 11:
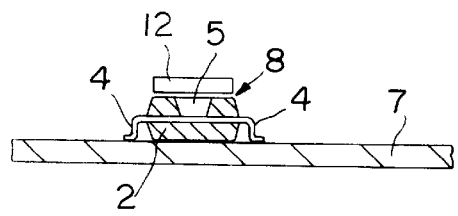
FIGS. 11 through 14 show different methods of mounting the pressure transducer of FIG. 4 on a circuit board using SMD technology.
Figure 12:
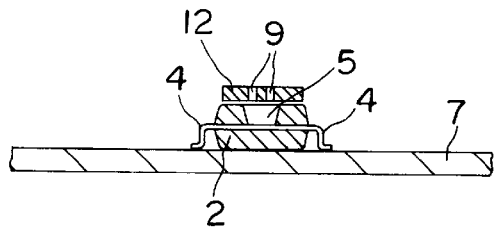
Figure 13:
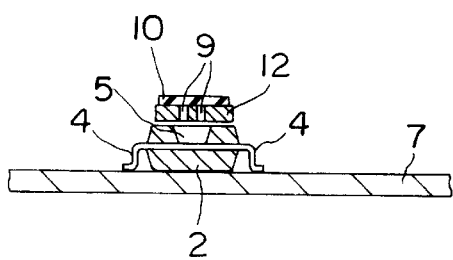
Figure 14:
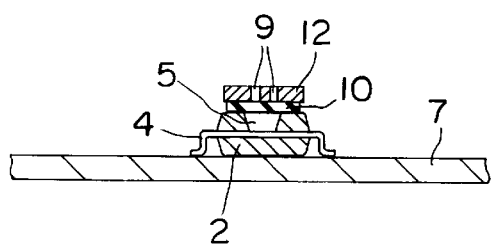
Figure 15:
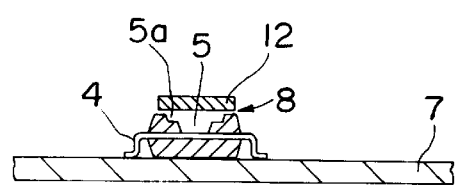
FIG. 15 shows a variation of FIG. 11, specifically with a pressure transducer according to FIGS. 5 and 6.

FIGS. 16 through 19 show the plate serving as shielding in FIG. 11, in a view of its side facing the pressure transducer, with different methods of patterning the surface; and FIGS. 20 and 21 show the possibility of encapsulating the pressure transducer for the mounting methods illustrated in FIGS. 11 through 15.

Parts that are identical to or correspond to one another are labeled with the same reference characters in the various exemplifying embodiments.

Figure 1:
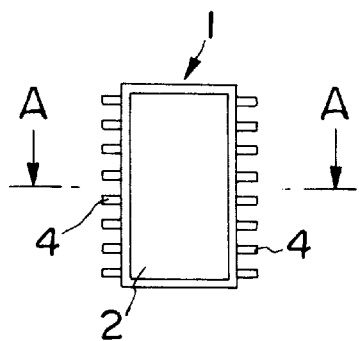
FIG. 1 shows a pressure transducer according to the invention, in a plan view of the side facing away from its pressure channel.
Figure 2:
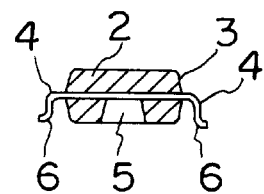
FIG. 2 shows the section A—A through the pressure transducer of FIG. 1.

Pressure transducer 1 shown in FIGS. 1 and 2 has an approximately parallelepipedal housing 2, rectangular in plan view, having beveled flanks 3. Housing 2 consists of an insulating molding compound. Projecting from the housing are leads 4 which are cut out from a lead frame and bent into approximately a Z-shape. Leads 4 are the connecting lines to an electronic pressure sensor (not shown in detail) which is encased by the molding compound. Provided centeredly on the underside of housing 2 is a channel 5, tapering in conical fashion from the outside in, which allows access to the pressure sensor by a fluid which transfers the pressure to be measured. The fluid involved is predominantly air, but other gases or liquids which are compatible with the sensor, e.g. an oil, are also possible. Feet 6 of leads 4 project slightly beyond the underside of housing 2.

Figure 3:
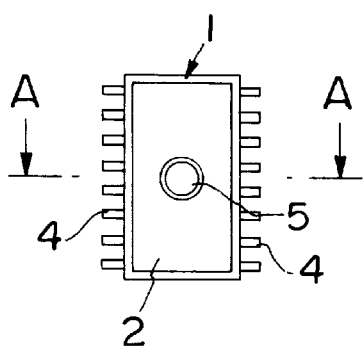
FIG. 3 shows another embodiment of the pressure transducer, in a plan view of the side having the pressure channel.
Figure 4:
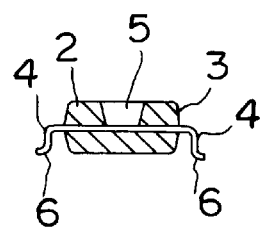
FIG. 4 shows the section A—A through the pressure transducer of FIG. 3.

The pressure transducer shown in FIGS. 3 and 4 differs from the pressure transducer shown in FIGS. 1 and 2 in that channel 5 is located not on the underside, but on the upper side of the housing.

Figure 5:
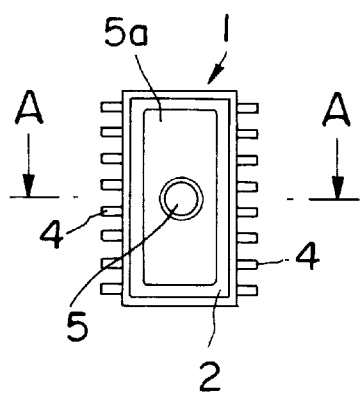
FIG. 5 shows a third embodiment of a pressure transducer, in a plan view of its side having the pressure channel.
Figure 6:
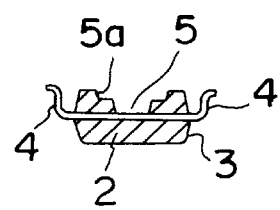
FIG. 6 shows the section A—A through the pressure transducer of FIG. 5.

The pressure transducer shown in FIGS. 5 and 6 differs from the pressure transducer shown in FIGS. 1 and 2 in that channel 5 has a conical widening 5a, set off in stepped fashion, which extends over almost the entire underside of housing 2 and by which the cubic capacity of channel 5 is substantially increased.

Figure 7:
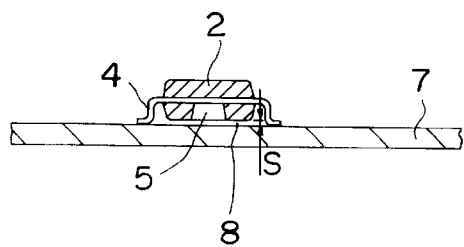
FIGS. 7 through 10 show different methods of mounting the pressure transducer of FIG. 2 on a circuit board using SMD technology.

If the pressure transducer shown in FIG. 2 is mounted on a circuit board 7 using SMD technology, the result is as shown in FIG. 7: circuit board 7 shields channel 5. There exists between the underside of housing 2 and circuit board 7 a narrow gap 8 with a height s (shown in FIG. 7 at exaggerated scale) which allows the fluid (which is preferably air) to enter channel 5 through a flow resistance. The flow resistance constitutes, in conjunction with the cubic capacity of channel 5, a fluid low-pass which prevents rapid pressure fluctuations from reaching the pressure sensor. The flow cross section constituted by gap 8 can be varied by varying its height s, for example by the fact that feet 6 of leads 4 project to a greater or lesser extent beyond the underside of housing 2. Because it requires no modification to the punching and bending tool which shapes leads 4, it is simpler to pattern gap 8, in particular by forming copper traces or printing on solder metal or printing on a solder resist or applying some other printing paste at the location of gap 8 when the circuit board is produced, or by locally milling out the circuit board. Milling out the circuit board at the point located opposite channel 5 can moreover increase the cubic capacity of the fluid capacitance (pressure capacitance), which helps determine the time constant of the pressure sensor. The stepped widening 5a of channel 5 shown in FIGS. 5 and 6 also serves to increase said time constant.

Gap 8 can be utilized to prevent troublesome particles from getting beneath housing 2 and into channel 5 along with the fluid. If the diameter of the smallest troublesome particle is known, height s between housing 2 of the pressure transducer and circuit board 7 can then be selected to be smaller than the smallest troublesome particle. height 2 of gap 8 can be minimal or can indeed be reduced to zero, if an access to channel 5 is created through circuit board 7. In the exemplifying embodiment according to FIG. 8, this is done by way of holes 9. The diameter D of these holes 9 can also be selected so that the smallest troublesome particles which occur cannot pass through circuit board 7. If the holes should then become so narrow that the flow resistance is too great, or if the troublesome particles are so small that holes 9 cannot exclude them, it is additionally possible to provide a filter 10 which, in the exemplifying embodiment according to FIG. 9, is adhesively bonded onto the underside of circuit board 7 and covers holes 9. This filter, which for example can be a textile filter mat, can serve not only as a fine filter (dust filter), but is also suitable for influencing the flow resistance. It is possible in particular to influence the flow resistance if a filter is inserted into channel 5 and/or into its widening.

If it is desired to encapsulate the pressure transducer together with further components of an electronic circuit (not depicted here) provided on circuit board 7, provision must be made in the exemplifying embodiment according to FIG. 7 for a channel, leading through sealing compound 8 to gap 8, to remain open in the sealing compound. This is simpler in the exemplifying embodiments according to FIGS. 8 through 10, since access to channel 5 occurs through circuit board 7. All that is necessary in this case is to ensure that during encapsulation, the sealing compound does not penetrate into gap 8 and further into channel 5. This can on the one hand be achieved by making gap 8 sufficiently narrow, and coordinating the height s of the gap with the viscosity of the sealing compound in such a way that the latter cannot flow beneath the housing. Another approach, however, is to seal gap 8 prior to actual encapsulation, as shown in FIG. 10. For this purpose, for example, a conventional SMD adhesive can be applied onto the underside of housing 2 before pressure transducer 1 is mounted and soldered onto circuit board 7.

Gap 8 can, however, also be closed off after pressure transducer 1 has been soldered to circuit board 7, for example by applying an adhesive.

Figure 8:
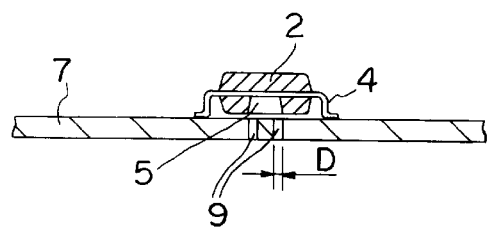
Figure 9:
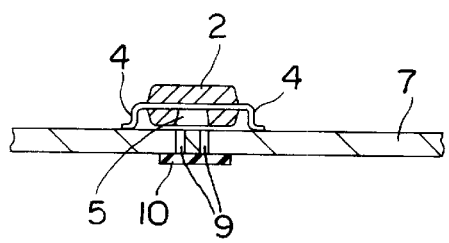
Figure 10:
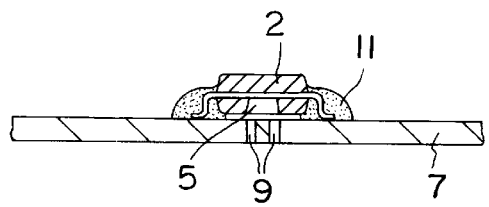

The exemplifying embodiments shown in FIGS. 8 through 10 are particularly suitable for use in tire pressure monitoring.

The pressure transducer shown in FIGS. 5 and 6 can also be mounted in the manners shown in FIGS. 7 through 10.

FIGS. 11 through 14 show how the pressure transducer shown in FIGS. 3 and 4 can be mounted in accordance with the invention. The exemplifying embodiments in FIGS. 11 through 14 differ from those in FIGS. 7 through 10 in that channel 5 faces not toward circuit board 7, but upward; the task of shielding it is taken over in this case by a separate plate 12, access to channel 5 being realized in a manner analogous to that in the embodiments shown in FIGS. 7 through 10, namely in FIG. 11 via a narrow gap 8 between plate 12 and the upper side of housing 2, and in FIGS. 12 through 14 via holes 9 in plate 12, optionally in combination with a filter 10 which can be arranged on plate 12 (see FIG. 13) or between plate 12 and housing 2 (see FIG. 14).

In the examples shown in FIGS. 11 through 14 as well, channel 5 can have a stepped widening 5a (see FIG. 15) which increases the time constant of pressure transducer 1 and at the same time makes it possible to provide a greater number of holes 9 in plate 12, and/or longer flow paths.

FIG. 16 shows the underside of plate 12 of FIG. 11. The underside has been patterned by having been selectively imprinted with a printing paste 13 to form meandering channels 14 which begin from a few points on a edge of plate 12 (four points, in the example shown), and proceed circuitously until meeting at the center of plate 12, at a point 15 (indicated with dashed lines) which is located opposite channel 5. The flow resistance of the channels can be modified by changing their shape and dimensions. The method of patterning the underside of plate 12 shown in FIG. 17, with a plurality of channels 14 extending in a star shape, results in a lower flow resistance than the example in FIG. 16. With the method of patterning the underside of plate 12 shown in FIG. 18, only two channels 14 are formed, each leading through a larger chamber 16 and thus resulting in a considerable damping of the response characteristics of the pressure transducer. In the exemplifying embodiment according to FIG. 19, a frame-like border 17 on the underside of plate 12 encloses a chamber 18 which, together with the cubic capacity of channel 5 which opens into said chamber 18, and together with the flow resistance of gap 8 between plate 12 and housing 2, constitutes a fluid low-pass which damps the response characteristics of the pressure transducer. A corresponding patterning is also possible on the upper side of circuit board 7 in the case of the mounting method shown in FIGS. 7 through 10. Patterning can be accomplished not only by means of a printing paste, but also—and particularly on circuit board 7 - by selective metallization (as is known in the art for the formation of conductive trace patterns), by selective application of a solder metal or a solder resist, or by using milled or plastic shaped elements with channels.

Encapsulation of the pressure transducer according to FIG. 4 is made possible by the fact that the opening of pressure channel 5 is sealed by a suitable element 19 which is a component of a housing 20 that surrounds pressure transducer 1 and the electronics that may be associated with it (see FIG. 20); said element 19 can additionally be sealed by way of a sealing ring 21 or by filter 10. Another possibility is to insert a sleeve 22 into channel 5 (see FIG. 21). Sleeve 22 must be long enough to project above the subsequent upper rim of the encapsulation.

What is clamed is:

1. An apparatus made up of an electrical circuit board and an electrical pressure transducer which has, in a housing, a pressure sensor onto which the pressure to be measured is transferred by means of a fluid through a channel leading into the housing, said channel having a given fluid flow resistance, and from which there proceed electrical lines which project out of the housing as leads and are connected to the circuit board, wherein the channel is shielded by mechanical shielding means associated to the outer side of the housing so that the flow resistance for fluid entering and leaving the channel increases above said given fluid flow resistance of said channel.

2. An apparatus made up of an electrical circuit board and an electrical pressure transducer which has, in a housing, a pressure sensor onto which the pressure to be measured is transferred by means of a fluid through a channel leading into the housing, said channel having a given fluid flow resistance, and from which there proceed electrical lines which project out of the housing as leads and are connected to the circuit board, wherein the channel is shielded by mechanical shielding means in form of a plate.

3. The apparatus as defined in claim 2, wherein the plate is the circuit board.

4. The apparatus as defined in claim 1 wherein the leads of the pressure transducer are joined to the circuit board using SMD technology.

5. An apparatus made up of an electrical circuit board and an electrical transducer which has, in a housing, a pressure sensor onto which the pressure to be measured is transferred by means of a fluid through a channel leading into the housing, said channel having a given fluid flow resistance, and from which there proceed electrical lines which project out of the housing as leads and are connected to the circuit board, wherein the channel is shielded by mechanical shielding means in form of a cap.

6. The apparatus as defined in claim 5, wherein the cap is formed by hollowing out a plate.

7. The apparatus as defined in claim 1, 2 or 5 wherein the width of the channel is increased along its length from the inner end to the outer end of the channel.

8. The apparatus as defined in claim 7, wherein the widening of the channel is accomplished in steps.

9. The apparatus as defined in claim 1, 2 or 5 wherein a filter is provided between the shielding means and the housing.

10. The apparatus as defined in claim 1, wherein the shielding means is perforated.

11. The apparatus as defined in claim 10, wherein the shielding means is covered by a filter.

12. The apparatus as defined in claim 1, 2 or 5 wherein the (channels subdivided by fins run between) flow resistance is increased by providing channels between the housing and the shielding means for passing the fluid to said channel in the housing, wherein the length and cross section of the channels determine the fluid flow resistance.

13. The apparatus as defined in claim 12, wherein the channels are provided in the surface of the housing and/or of the shielding means.

14. The apparatus as defined in claim 1, 2 or 5 wherein a gap is provided between the housing and the shielding means by providing a pattern in the shielding means or in the surface of the housing.

15. The apparatus as defined in claim 14, wherein the gap is formed by the provision of copper traces, by single or repeated printing on of solder metal, solder resist, or printing paste, or by milled-out recesses in the shielding means or in the adjacent housing, or by interposing a milled or shaped element equipped with one or more channels.

16. The apparatus as defined in claim 3, (one of claims) wherein the gap between the circuit board and the housing is entirely sealed, and to allow pressure transducer, one or more holes which communicate with the channel are provided in the circuit board.

17. An apparatus for monitoring the air pressure in tires on vehicle wheels comprising a valve and a valve base and also having an apparatus as defined in claim 1, 2 or 5 to be provided on or in the valve base.

18. The apparatus as defined in claim 2 or 5, wherein the leads of the pressure transducer are joined to the circuit boards using SMD technology.

19. The apparatus as defined in claim 2 or 5, wherein a filter is provided under the shielding means.

20. The apparatus as defined in claim 2 or 5, wherein the shielding is perforated.

21. The apparatus as defined in claim 14, wherein the gap is formed by the provision of copper traces, by single or repeated printing on of solder metal, solder resist, or printing paste, or by milled-out recesses in the shielding means and in the adjacent housing.

* * * * *